United States Patent
Chen et al.

(10) Patent No.: US 6,506,619 B2
(45) Date of Patent: Jan. 14, 2003

(54) STRUCTURE OF A CMOS IMAGE SENSOR AND METHOD FOR FABRICATING THE SAME

(75) Inventors: Chong-Yao Chen, Chang-Hua (TW); Chen-Bin Lin, Taipei (TW)

(73) Assignee: United Microelectronics, Corp., Hsinchu (TW)

( * ) Notice: Subject to any disclaimer, the term of this patent is extended or adjusted under 35 U.S.C. 154(b) by 0 days.

(21) Appl. No.: 10/104,707

(22) Filed: Mar. 25, 2002

(65) Prior Publication Data

US 2002/0192913 A1 Dec. 19, 2002

Related U.S. Application Data

(62) Division of application No. 09/885,467, filed on Jun. 19, 2001.

(51) Int. Cl.$^7$ ................................................ H01L 21/00
(52) U.S. Cl. ........................ 438/48; 438/70; 438/199; 438/253
(58) Field of Search .................... 438/48, 70, 199, 438/200, 201, 230, 232, 275, 303–307, 592, 593; 257/290–293, 53, 231–233, 369

(56) References Cited

U.S. PATENT DOCUMENTS

| | | | |
|---|---|---|---|
| 6,022,776 A | * 2/2000 | Lien et al. | 257/296 |
| 6,040,592 A | * 3/2000 | McDaniel et al. | 257/291 |
| 6,221,687 B1 | * 4/2001 | Abramovich | 438/69 |
| 6,326,652 B1 | * 12/2001 | Rhodes | 257/231 |
| 6,329,233 B1 | * 12/2001 | Pan et al. | 438/199 |

* cited by examiner

Primary Examiner—David Nelms
Assistant Examiner—Long Tran
(74) Attorney, Agent, or Firm—Charles C. H. Wu; Wu & Cheung, LLP

(57) ABSTRACT

A method of fabricating CMOS image sensor. On a substrate, an isolation layer is formed to partition the substrate into a photodiode sensing region and a transistor element region. Next, on the transistor element region, a gate electrode structure is formed and then, a source/drain region is formed at the transistor element region of the two lateral sides of the gate electrode structure. At the same time, a doping region is formed on the photodiode sensing region. After that, a self-aligned barrier layer is formed on the photodiode sensing region and a protective layer is formed on the substrate. Then, a dielectric layer and a metallic conductive wire are successively formed on the protective layer. Again, a protective layer is formed on the dielectric layer and the metallic conductive wire, wherein the numbers of the dielectric layers and the metallic conductive wire depend on the fabrication process. A protective layer is formed between every dielectric layer.

11 Claims, 5 Drawing Sheets

STRUCTURE OF A CMOS IMAGE SENSOR AND METHOD FOR FABRICATING THE SAME

This application is a divisional of copending application (s) application Ser. No. 09/885,467 filed on Jun. 19, 2001 still pending.

BACKGROUND OF THE INVENTION

1. Field of the Invention

The present invention relates to a structure of a photodiode image sensor device and a method for fabricating the same, and more particularly to a structure of a complimentary metal-oxide semiconductor (CMOS) image sensor and a method of fabricating the same.

2. Description of the Related Art

A photodiode image sensor is a commonly found image sensor element. A typical photodiode image sensor is a sensing region and comprises at least a reset transistor and a diode. For example, a diode is formed from a N-type doping region while a P-type substrate serves as the sensing region. In operation, a voltage is applied to the gate electrode of reset transistor so that after initiation of the reset transistor, the N/P diode junction capacitor is charged. When a high potential is attained during charging, the reset transistor is switched off, so that the N/P diode produces reverse bias to form a void region. When light strikes the N/P diode sensing region, the produced electronholes are divided by the electric field of the void region such that electrons move toward the N-type doping region and the potential of the N-type doping region is reduced, and the electron-holes move to the P-type substrate.

A charge-coupled device (CCD) possesses dynamic range, low dark current and the technology development thereof is mature. As a result, it is the most commonly employed image sensor. However, the fabrication process of CCD is specific, which causes the costs to be expensive, and drive circuits must be operated with high voltage which causes high power dissipation. Further random access problems cannot be solved.

The CMOS image sensor possesses high quantum efficiency, low Read noise, high Dynamic range and random access and is fully compatible with the CMOS fabrication process. Thus, a CMOS can be integrated onto a chip with other controlled circuits, A/D converter circuits and digital signal treatment circuits, thereby creating a system on a chip (SOC). Thus, a CMOS image sensor fabrication process greatly reduces the cost of an image sensor, pixel size, and power dissipation. Accordingly, in recent years, CMOS image sensors have been used to replace CCDs.

A conventional fabrication method of CMOS image sensor is briefly described as follows:

Referring to FIG. 1A, first, a field oxide layer 102, a gate oxide layer 104 of a reset transistor 130 and a polycrystalline silicon gate electrode 106 are formed on a substrate 100. Next, the field oxide layer 102 and the polycrystalline silicon gate electrode 106 are used as an implant masking screen for an ion implantation and thermal driving in fabrication process whereby a source/drain region 108 and a doping region 112 of the photodiode sensing region 110 are formed in the substrate 100.

After that, at the lateral wall of the polycrystalline silicon gate electrode 106 and the gate electrode oxide layer 104, a spacer 114 is formed. After that, a self-aligned barrier (SAB 116) is formed on the photodiode sensing region 110 so as to form a photodiode CMOS image sensing element.

The backend process of forming a photodiode CMOS image sensing element is shown in FIG. 1B. In the backend process, for example, a dielectric layer 118 is formed on the substrate 100, and then a metallic conductive wire 120 is formed is formed on the dielectric layer 118. After that, a dielectric layer 122 is formed over the substrate 100, and a metallic conductive wire 124 is formed on the dielectric layer 122.

However, the CMOS image sensor obtained by the conventional fabrication process has the following drawbacks:

In the course of the backend process, for instance, in defining the contact window/dielectric layer window opening and defining the metallic conductive, a plasma etching process must be used. This plasma etching method possesses relatively large energy which will cause a relatively large voltage drop. This voltage drop not only damages common transistor elements but also damages the surface of the photodiode sensing region. In particular, the damage by the plasma at the bird's beak region of the field oxide periphery is more serious. Thus, the photodiode sensing region produces current leakage. This current leakage problem in turn causes the sensor to produce a relatively large dark current, causing Read Noise to increase.

Further, in the course of forming a plurality of sensors on the same wafer, the numerical size distribution of the dark current for a single sensor has a relatively large range, ie., the difference between the numerical values of the dark current of every sensor can be very large and this causes non-uniformity in the sensors.

SUMMARY OF THE INVENTION

Accordingly, it is an object of the present invention to provide a structure of a CMOS image sensor and method for fabricating the same, wherein a protective layer is formed between the surface of the element and the dielectric layer, and is also formed between each dielectric layers to prevent damage by plasma.

Yet another object of the present invention to provide structure of a CMOS image sensor and method for fabricating the same, wherein the problem of dark current can be reduced to a minimum.

Another object of the present invention to provide structure of a CMOS image sensor and method for fabricating the same, wherein the uniformity of a CMOS image sensor can be increased.

One aspect of the present invention is to provide a structure of a CMOS image sensor comprising a photodiode sensing region, a transistor element region, a transistor, a self-aligned barrier, a dielectric layer and a first, second protective layers, wherein the photodiode sensing region and the transistor element region are located on the substrate and the transistor is located on the transistor element region. The self-aligned barrier is located on the photodiode sensing region, and the first protective layer is located on the entire substrate and covers the self-aligned barrier. A plurality of dielectric layers are each formed on the first protective layer, wherein each of the dielectric layers is separated from the first protective layer by different heights, and a plurality of second protective layers, each of which is mounted on the adjacent dielectric layers.

Yet another aspect of the present invention is to provide a method of fabricating a CMOS image sensor. An isolation layer is formed on a substrate to partition the substrate into a photodiode sensing region and a transistor element region. Next, on the transistor element region, a gate electrode structure is formed and a lightly ion implantation process is performed such that a lightly drain doping region is formed on the transistor element and a lightly doped region is formed on the photodiode sensing region. After that, a spacer is formed on the gate electrode structure and a high ion implantation step is performed so that a source/drain region is formed on the transistor element and a highly doped region is formed on the photodiode sensing region. After that, after a layer of self-aligned barrier is formed on the photodiode sensing region, a layer of protective layer is formed on the substrate so as to cover the entire substrate. The material between the protective layer and the self-aligned barrier layer possesses different refractivity. After that, the backend process of the sensor element is performed. In the backend process, by forming successive dielectric layers and metallic conductive wires on the protective layer and then a protective layer thereon, in which the number of dielectric layers and the metallic wires depend on the fabrication process, a protective layer is formed between each dielectric layers.

In view of the above, the present invention is characterized by, after the formation of the photodiode CMOS image sensor, covering the entire substrate with a protective layer. The invention is further characterized by forming a protective layer between dielectric layers in the back-end process. By means of the action of the protective layers, damage to the photodiode sensing region due to the application of the plasma etching used in the back-end process can be avoided, and in turn, the production of the dark current is reduced to a minimum.

Further, other than the essential protected photodiode sensing region, these protective layers cover the entire substrate, and other remaining regions are also protected from the damage of the plasma etching fabrication process.

In addition, with respect to a plurality of sensors on the same chip, the sensor having a plurality of protective layers is provided with dark current having its size distribution concentrated within a dense range. Thus, the dark current characteristics of those sensors are near to each other, i.e., these CMOS image sensors are provided with relatively excellent uniformity.

In addition, the protective layer and the material of the self-aligned barrier and the dielectric layer have different refractivities. Due to refraction of an incident ray entering the surface of the photodiode sensing region by the protective layer and the dielectric layer, the self-aligned barrier of material having different refractivities, and the photodiode sensing region absorbing the refracted incident ray, the photodiode region is provided with a preferred conversion ability to generate photons and thus the photo diode sensing region has a higher quantum efficiency.

DESCRIPTION OF THE PREFERRED EMBODIMENTS

Figure 1A:
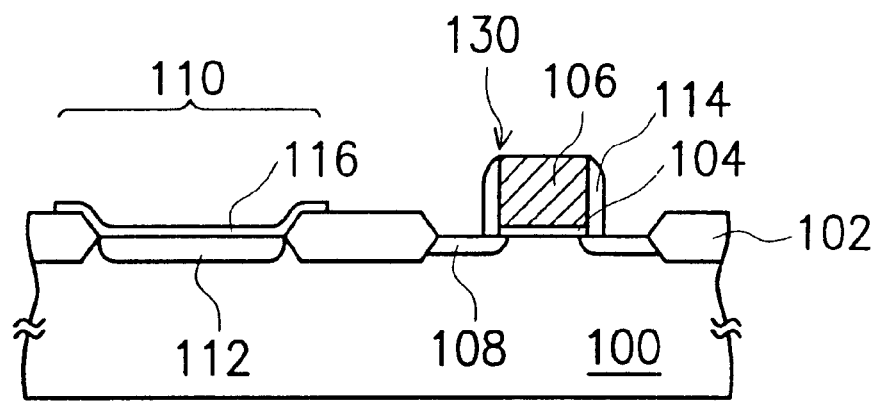
FIGS. 1A to 1B are cross-sectional views illustrating a conventional CMOS image sensor.
Figure 1B:
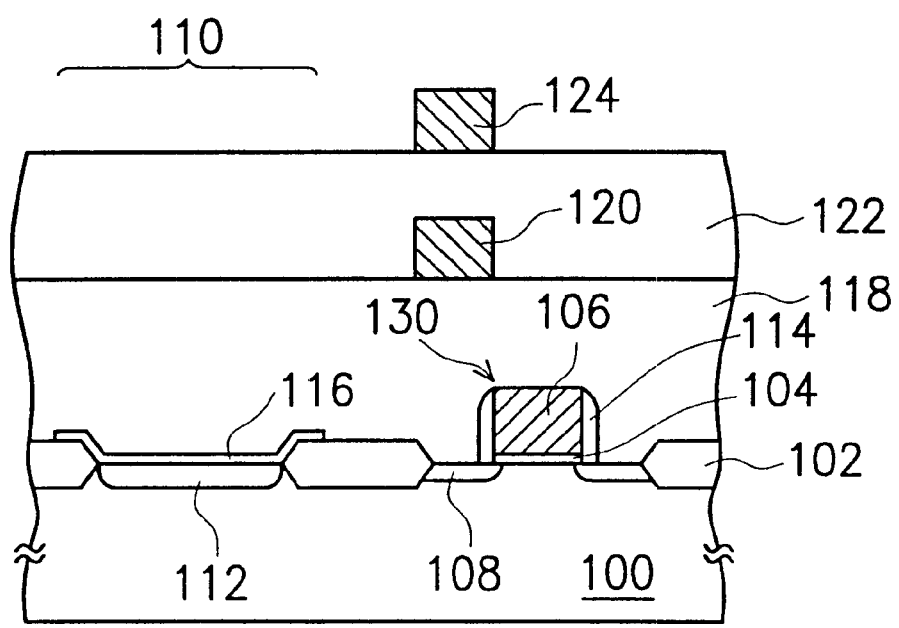

The preferred embodiment of the present invention will be described with reference to the accompanying drawings. Like or corresponding members are designated by like reference characters or corresponding reference characters.

Figure 2A:
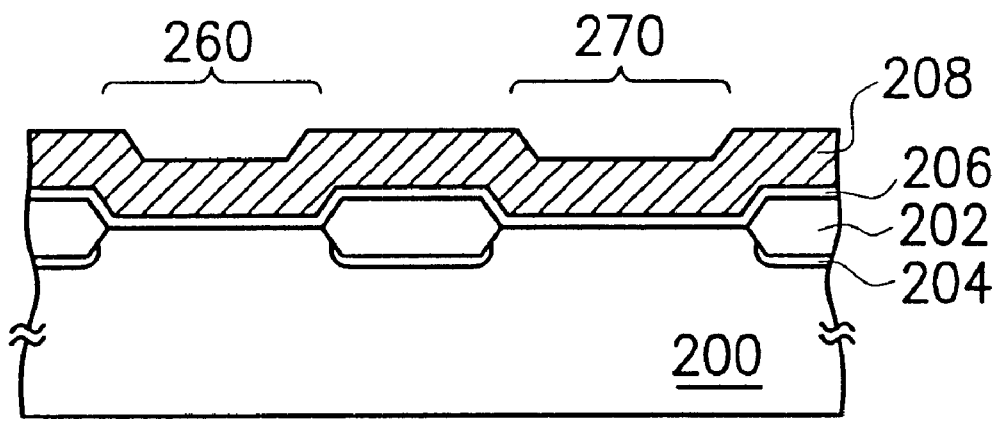
FIGS. 2A to 2F are cross-sectional views illustrating a method for fabricating CMOS image sensor according to a preferred embodiment of the present invention.
Figure 2B:
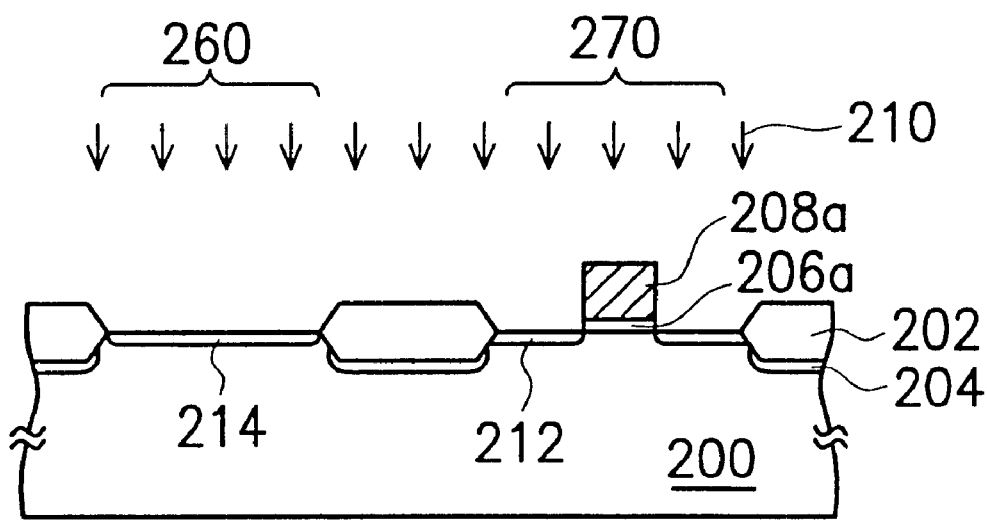
Figure 2C:
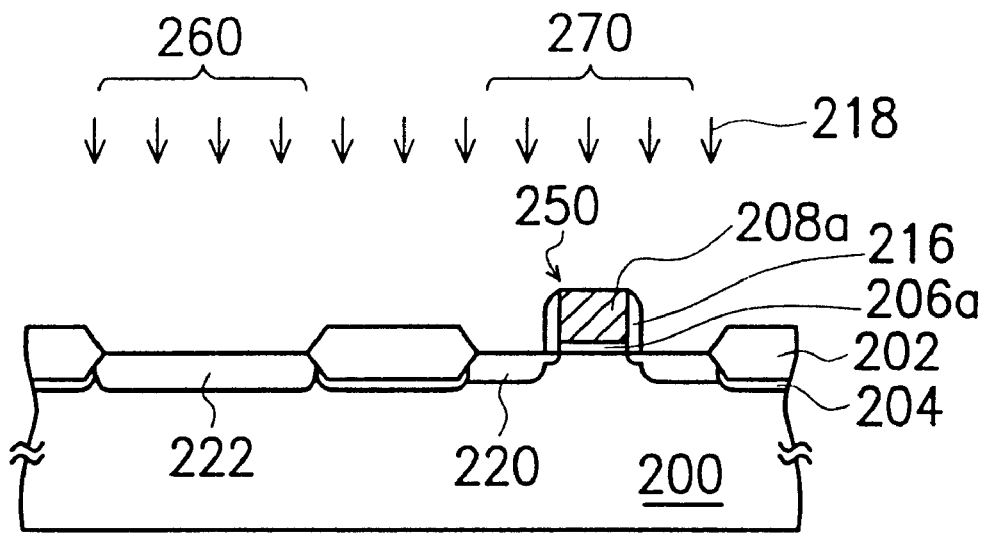
Figure 2D:
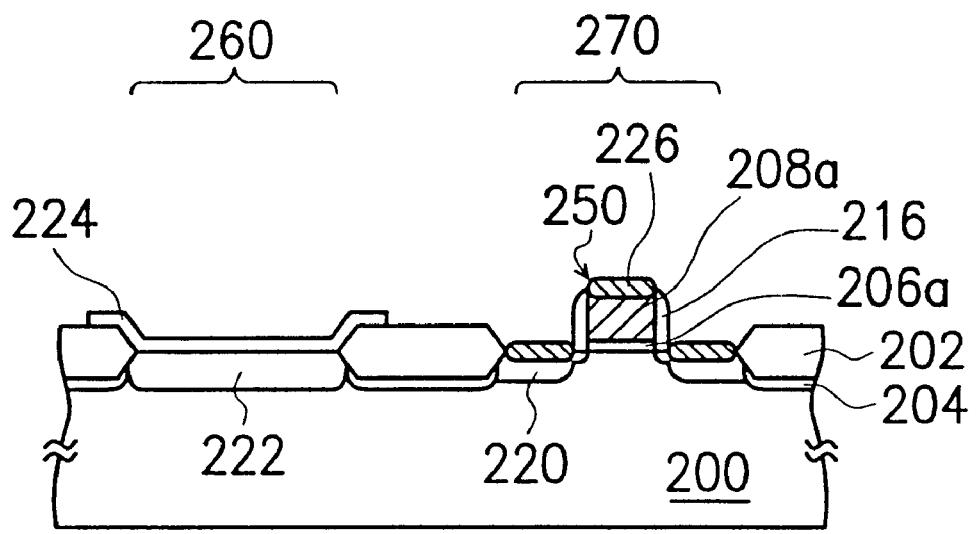
Figure 2E:
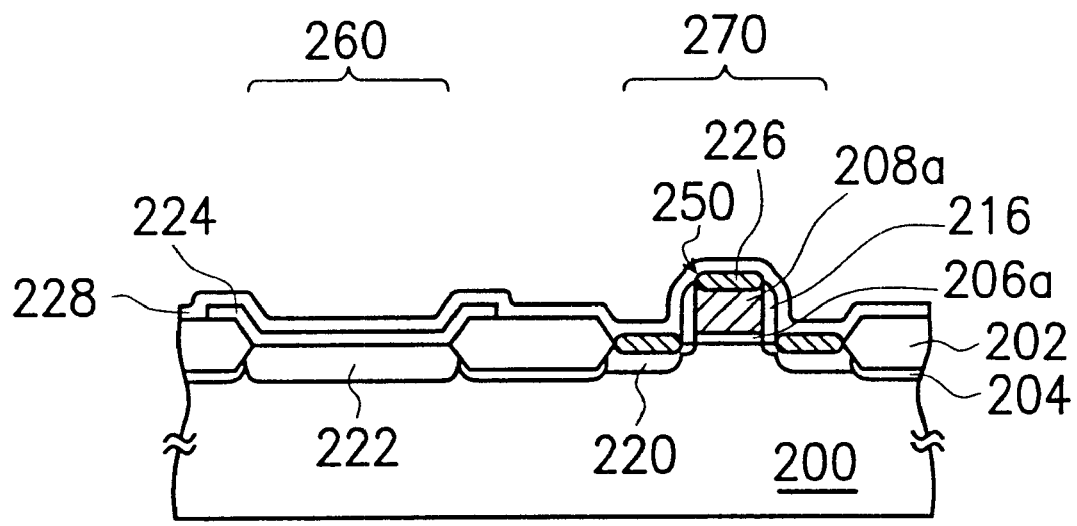
Figure 2F:
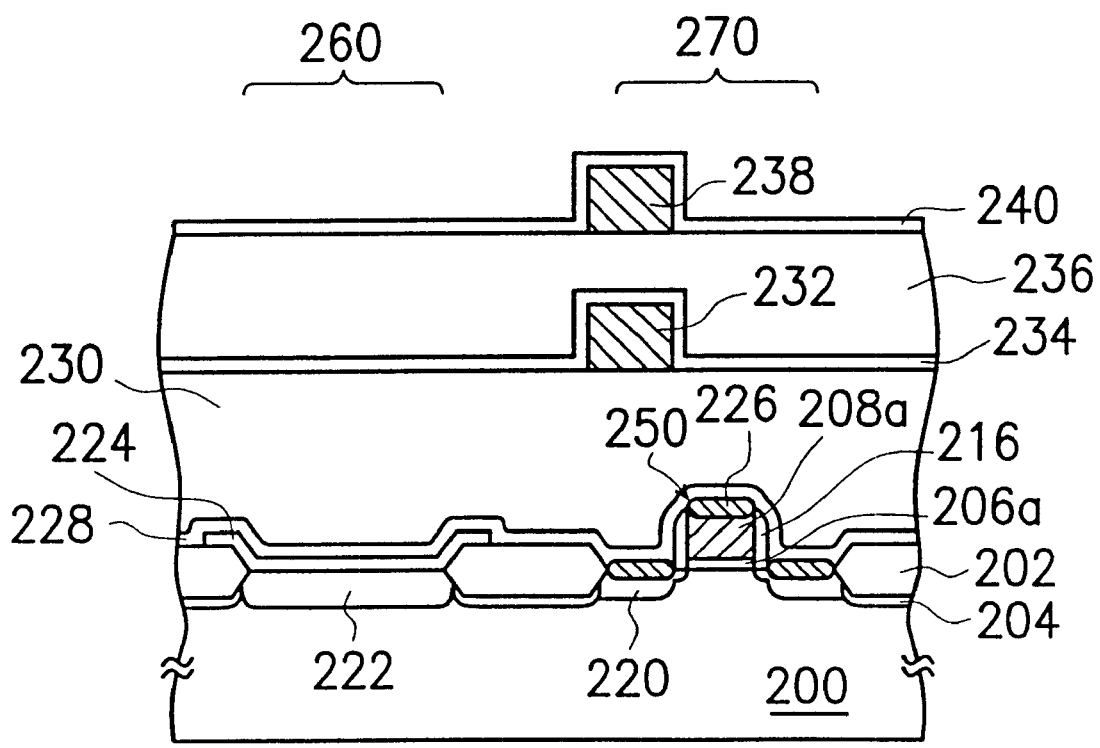

FIG. 2F illustrates a CMOS image sensor of the present invention comprising a photodiode sensing region 260, a transistor element region 270, a transistor 250, a self-aligned barrier 224, protective layers 228, 234, 236, dielectric layers 230, 234 and metallic conductive wires 232, 236.

The photodiode sensing region 260 and the transistor element region 270 are located within a substrate 200, and an isolation layer 202 partitions the photodiode sensing region 260 and the transistor element region 270. Underneath the isolation layer 202, a channel isolation region 204 is formed.

The transistor 250 is, for example, a reset transistor or a transmit transistor, and includes a gate oxide layer 206a, a gate electrode conductive layer 208a, a spacer 216, and a source/drain region 220. The gate oxide layer 206a and the gate electrode conductive layer 208a are located on the transistor element region 270, and the spacer 216 is located on the lateral walls of the gate oxide layer 206a and the gate electrode conductive layer 208a. The source/drain region 220 is positioned within the transistor element region 270 at the two lateral sides of the spacer 216.

The material of the gate oxide layer 204a is silicon oxide and the method of forming the gate oxide layer 204a is, for example, thermal oxidation. The material of gate electrode conductive layer 206a is, for example, polycrystalline silicon, polycrystalline silicon metal constituted from polycrystalline silicon and metal silicides, or metals. The method of fabrication is, for example, chemical vapor phase deposition or sputtering. When the gate electrode conductive layer 208a is polycrystalline silicon, the gate electrode conductive layer 208a and the source/drain region 220 of the preferred transistor 250 include a metallic silicon layer 226 so as to reduce its plate resistance.

The photodiode sensing region 260 is constituted from a highly doped region 222 and the substrate 220. The doping type of the highly doped region 222 is similar to that of the source/drain region 220, but is different from that of the substrate 200. When the doping type of the substrate 200 is p-type, the doping type of the highly doped region 222 is n-type. If the doping type of the substrate 200 is n-type, the doping type of the highly doped region 222 is p-type.

The self-aligned barrier 224 is located on the photodiode sensing region 260 and the material of the self-aligned barrier 224 is, for example, silicon oxide formed by plasma enhanced chemical vapor phase deposition.

The protective layer 228 covers the self-aligned barrier 224 and is located on the entire substrate 200. The material of the protective layer 228 is, for example, silicon nitride, and the method of formation is, for example, plasma enhanced chemical vapor phase deposition.

The dielectric layer 230, the metallic conductive wire 232 and the protective layer 234 are formed successively on the protective layer 228, wherein the material of the dielectric layer 230 is, for example, silicon oxide, and the method of fabricating the dielectric layer 230 is plasma enhanced chemical vapor phase deposition. The material of the metal conductive wire 232 is polycrystalline silicon, aluminium, copper or tungsten and the method of formation is magneton direct current sputtering method and chemical vapor phase deposition. The material of the protective layer 234 is, for example, silicon nitride and the method of formation is plasma enhanced chemical vapor phase deposition. Silane and ammonia are introduced as the process gas.

The dielectric layer 236, the metallic conductive wire 238 and the protective layer 240 are successively formed on the protective layer 234, and the method of formation is based on the formation methods of dielectric layer 230 the metallic conductive wire 232 and the protective layer 234.

In the above structure, the number of layers of the dielectric layer 230 and the metallic conductive wire 238 is based on requirements of the fabrication process, and, although the metallic conductive wire 238 is illustrated is FIG. 2F as being not connected, the electrically connection relationship of the metallic conductive wire 238 and the position thereof can be adjusted based on requirements of the fabrication process.

The method of fabricating CMOS image sensor is shown in FIGS. 2A to 2F.

First, referring to FIG. 2A, isolation layer 202 is formed on substrate 200 to define the photodiode sensing region 260 and the transistor element region 270. The channel isolation region 204 is formed beneath the isolation layer 202, in which the isolation layer 202 is, for example, a field oxide layer of silicon nitride material. The method of formation is, for example, localized region thermal oxidation. An insulating layer 206 and a conductive layer 208 are then successively formed on the substrate 200. The material of the insulating layer 206 is, for example, silicon oxide, and the method of formation is thermal oxidation.

The material of the conductive layer 208 is, for example, polycrystalline silicon, polycrystalline silicon metal constituted from polycrystalline silicon and metallic silicode or metals, and the method of formation is, for example, chemical vapor phase deposition or magneton direct current sputtering.

Next, referring to FIG. 2B, micro-imaging and etching step are used to define the conductive layer 208 and the insulating layer 206, and on the transistor element region 270, the gate electrode conductive layer 208a and the gate oxide layer 206a of the transistor 250 are formed. After that, the isolation layer 202 and the gate electrode conductive layer 208a are used as a masking screen to perform a lightly doped ion implantation step 210 on the substrate 200, and to form a lightly doped drain region 212 on the substrate 200 at the two lateral side of the gate electrode conductive layer 208a and the gate oxide layer 206a, and to form a lightly doped region 214 on the photodiode sensing region 260, wherein the lightly ion implantation step 210 depends on the p-type or n-type substrate 200, for example, the n-type implanted dopant is phosphorous or Arsenic, the p-type implanted dopant is boron.

Next, referring to FIG. 2C, a spacer 216 is formed on the lateral wall of the gate electrode conductive layer 208a and the gate oxide layer 206a. The material of the spacer 216 is, for instance, silicon oxide, and the method of formation is, for example, chemical vapor phase deposition. The substrate 200 is first covered with a layer of silicon oxide (not shown) and anisotropic etching is used to form the spacer 216. After that, the isolation layer 202, the gate electrode conductive layer 208a and the spacer 216 are used as a masking screen to perform a deep ion implantation step 218 on the substrate 200. A source/drain region 220 in the substrate 200 at the two lateral sides of the spacer 214 is formed into the source/drain region 220. The photodiode sensing region 260 is formed into a highly doped region 222. The deep ion implantation step 218 depends on the substrate being p-type or n-type, the implanted dopant for n-type is, for example, phosphorous or Arsenic, and for p-type is, for example, boron.

Next, referring to FIG. 2D, a self-aligned barrier 224 is formed on the photodiode sensing region 260. The material of the self-aligned barrier 224 is, for example silicon oxide and the method of formation is, for example, plasma enhanced chemical vapor phase deposition. The substrate 200 is first formed with a layer of silicon oxide layer (not shown), and then, a pre-fabricated self-aligned metal silicon oxide region, for instance, the silicon oxide layer of the transistor element region 270, is removed. After that, a self-aligned metallic silicon layer 226 is formed on the gate electrode conductive layer 208a of the transistor element region 270 and the source/drain 220.

Next, referring to FIG. 2E, the protective layer 228 is formed on the substrate 200, in which the covered area of the protective layer 228 includes the photodiode sensing region 260, the transistor element region 270 and the not shown peripheral logic circuit region. The material of the protective layer 228 is, for example, silicon nitride, and the method of formation is, for example, plasma enhanced chemical vapor phase deposition. Silane and ammonia gas are introduced as the process gas.

After the formation of the photodiode CMOS image sensor, the entire substrate 200 is covered with a layer of protective layer 228. The plasma etching method used in the subsequent back-end process can thus avoid damaging the photodiode sensing region 260.

FIG. 2F illustrates the back-end process of the sensing element. The back-end process includes, for instance, covering the substrate 200 with a dielectric layer 230. Next, on the dielectric layer 230, the metallic conductive wire 232 is formed, and after that, on the dielectric layer 230 and the metallic conductive wire 232, the protective layer 234 is formed. The material of the dielectric layer 230 is silicon oxide and the method of formation is, for instance, plasma enhanced chemical vapor phase deposition. The material of the metallic conductive wire 232 is, for example, polycrystalline silicon, aluminum, copper or tungsten. The method of formation is, for example, magneton direct current sputtering and chemical vapor phase deposition to form a layer of metal layer (not shown), and then plasma etching to define the metallic conductive wire 232. The material of the protective layer 234 is, for example silicon nitride, and the method of formation is plasma enhanced chemical vapor phase deposition, and silane and ammonia gas are introduced as process gas.

After that, based on the similar fabrication method of dielectric layer 230, the metallic conductive wire 232 and the protective layer 234, the protective layer 234 is formed successively with the dielectric layer 236, the metallic conductive wire 238 and the protective layer 240. In the above back-end process, the number of layers of the dielectric layer 230 and the metallic conductive wire 232 is based on requirements of the fabrication process, and further, the metallic conductive wire 232 shown in FIG. 2F has not been connected, but the electrically connection relationship of the metallic conductive wire 232 and the position of the wire 232 are similarly adjusted based on requirements of the fabrication process.

Due to the fact that each time after the formation of the dielectric layer and the metallic conductive wire, the protective layer covers the dielectric layer and the metallic conductive wire, therefore, this further ensures that the plasma etching fabrication process will not damage the photodiode sensing region 260.

In addition, due to the action of the protective layers, for a plurality of CMOS image sensors on a same wafer, the size of the dark current generated by these elements is concentrated with a range, i.e., these elements are provided with uniformity.

Figure 3:
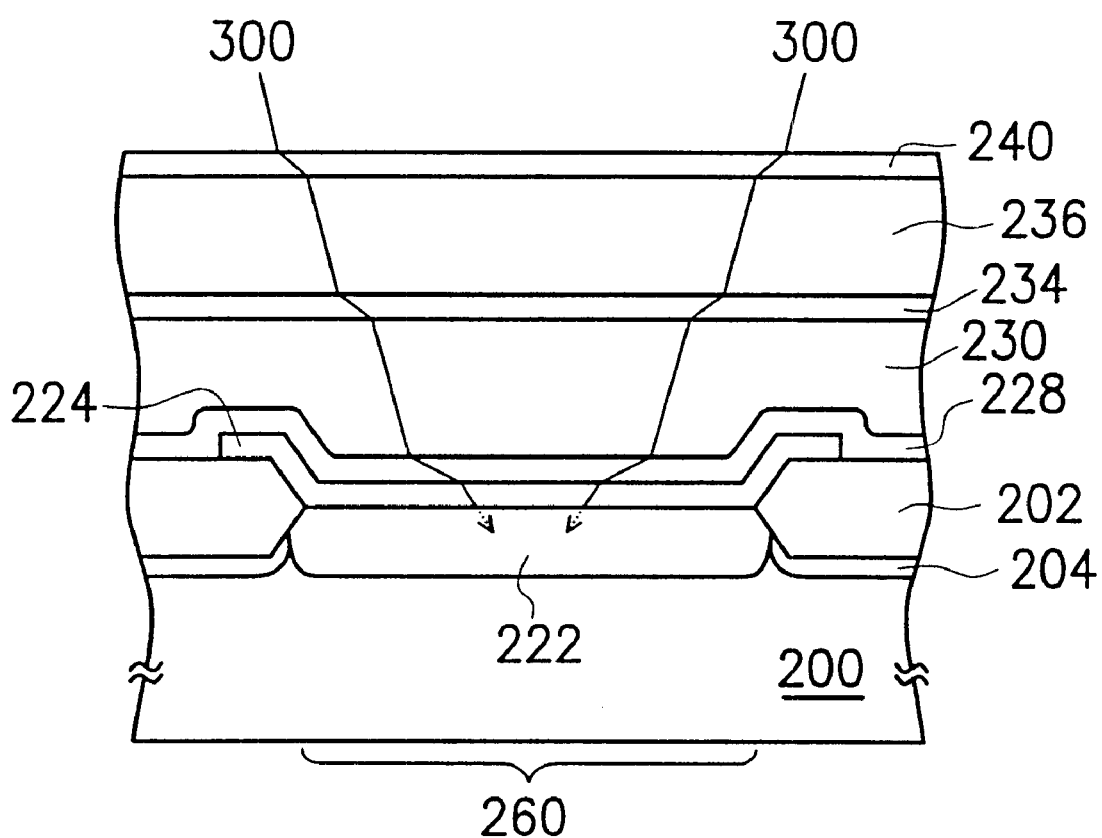
FIG. 3 schematically shows the incident light entering the CMOS image sensor of the preferred embodiment of the present invention.

Next, referring to FIG. 3, there is shown the photodiode sensing region 260 of the present invention, wherein the material of the protective layers 228, 234, 340 is silicon nitride and the material of the self-aligned barrier 224, the dielectric layers 230, 236 is silicon oxide. Due to the fact that there is a different refractivity between the two adjacent materials, when an incident ray 300 strikes the surface of the photodiode sensing region 260 via the protective layer 240, the dielectric layer 236, the protective layer 234, the dielectric layer 230, the protective layer 228 and the self-aligned barrier 224, after the photodiode sensing region 260 has received the incident ray 300, the photodiode sensing region 260 is provided with a conversion ability to generate photons, i.e., it possesses a relatively high quantum efficiency.

In view of the above, the present invention is characterized in that after the formation of the photodiode CMOS image sensor, the entire substrate is covered with a protective layer. The invention is also characterized by formation of a protective layer between all dielectric layers in the back-end process. By means of the action of the protective layers, damage to the photodiode sensing region due to the application of the plasma etching used in the back-end process can be avoided, and in turn, the production of the dark current is reduced to a minimum.

Further, other than the essential protected photodiode sensing region, these protective layers cover the entire substrate, and other remaining region is also protected from the damage of plasma etching fabrication process.

In addition, with respect to a plurality of sensors on the same chip, the sensor having a plurality of protective layers is provided with dark current having its size distribution concentrated within a dense range. Thus, the dark current characteristics of those sensors are near to each other, i.e., these CMOS image sensors are provided with relatively excellent uniformity.

In addition, the protective layer and the material of the self-aligned barrier and the dielectric layer have different refractivities. When an incident ray enters the surface of the photodiode sensing region, the ray is refracted by the protective layer and the dielectric layer, and the self-aligned barrier of materials having different refractivities. The photodiode sensing region absorbs the refracted incident ray, and the photodiode region is provided with a preferable conversion ability to generate photons and thus the photo diode sensing region has a higher quantum efficiency.

While the invention has been described with respect to preferred embodiment, it will be clear to those skilled in the art that modifications and improvements may be made to the invention without departing from the spirit and scope of the invention. Therefore, the invention is not to be limited by the specific illustrative embodiment, but only by the scope of the appended claims.

What is claimed is:

1. A method for fabricating a CMOS image sensor, the method comprising:

providing a substrate; forming a plurality of isolation layers on the substrate, wherein the isolation layers divide the substrate into a photodiode sensing region and a transistor element region; forming a gate oxide layer and a gate electrode conductive layer on the substrate; defining the gate electrode conductive layer and the gate oxide layer to form a gate structure on the transistor element region; forming a source/drain region within the transistor element region at two lateral sides of the gate structure while and simultaneously forming a doping region in the photodiode sensing region; forming a self-aligned barrier on the photodiode sensing region;

forming a first protective layer on the substrate; forming a first dielectric layer on the first protective layer; and repeating as above to form a plurality of second protective layers and a plurality of second dielectric layers on the first dielectric layer.

2. The structure of claim 1, wherein a surface of the first dielectric layer located between the second protection layer and the first dielectric layer and a surface of the second dielectric layer located between the second protective layer and the second dielectric layer are formed into a plurality of metallic conductive wires.

3. The structure of claim 1, wherein the first protective layer and the second protective layer include a material immune to corrosion by plasma etching.

4. The structure of claim 1, wherein the first protective layer and the second protective layers include silicon nitride.

5. The method of claim 4, wherein the first protective layer and the second protective layers are formed by plasma enhanced chemical vapor phase deposition.

6. The method of claim 5, wherein the reactive gas source in the plasma enhanced chemical vapor deposition includes silane and ammonia gas.

7. The method of claim 1, wherein the self-aligned barrier, the first dielectric layer and the second dielectric layer include silicon oxide.

8. The method of claim 1, wherein the self-aligned barrier, the first dielectric layer and the second dielectric layers are formed by plasma enhanced chemical vapor deposition.

9. The method of claim 1, further comprising performing self-aligned metal silicide fabrication to form a metal silicide on the gate electrode conductive layer and the source/drain region.

10. The method of claim 1, wherein the substrate contains p-type doping, and forming the source/drain region and implanting the doping region include n-type doping.

11. The method of claim 1, wherein the substrate contains n-type doping and forming the source/drain region and implanting the doping region includes p-type doping.

* * * * *